(12) United States Patent
Hsu et al.

(10) Patent No.: US 12,405,644 B2
(45) Date of Patent: Sep. 2, 2025

(54) FAN CONTROL SYSTEM

(71) Applicant: ADATA TECHNOLOGY CO., LTD., New Taipei (TW)

(72) Inventors: Shao-Wen Hsu, Taipei (TW); Shun-Wen Chan, Taipei (TW); Luca Di Fiore, New Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 409 days.

(21) Appl. No.: 18/083,666

(22) Filed: Dec. 19, 2022

(65) Prior Publication Data

US 2024/0057283 A1   Feb. 15, 2024

(30) Foreign Application Priority Data

Aug. 15, 2022   (TW) .................................. 111130533

(51) Int. Cl.
   *G06F 1/20*   (2006.01)
   *H05K 7/20*   (2006.01)

(52) U.S. Cl.
   CPC ............... *G06F 1/20* (2013.01); *G06F 1/206* (2013.01); *H05K 7/20136* (2013.01); *H05K 7/20209* (2013.01)

(58) Field of Classification Search
   CPC ...... G06F 1/20; G06F 1/206; G06F 2200/201; H05K 7/20136; H05K 7/20209
   USPC ....................................................... 700/300
   See application file for complete search history.

(56) References Cited

U.S. PATENT DOCUMENTS

| | | | |
|---|---|---|---|
| 6,791,836 B2 * | 9/2004 | Cipolla | G06F 9/526 361/679.48 |
| 2009/0125159 A1 | 5/2009 | Shen et al. | |
| 2010/0118486 A1 * | 5/2010 | Su | G06F 1/20 361/679.48 |
| 2011/0251733 A1 * | 10/2011 | Atkinson | G06F 1/206 700/300 |

(Continued)

FOREIGN PATENT DOCUMENTS

| | | |
|---|---|---|
| CN | 102220993 A | 10/2011 |
| CN | 103631348 A | 3/2014 |

(Continued)

*Primary Examiner* — Chun Cao
(74) *Attorney, Agent, or Firm* — Li & Cai Intellectual Property (USA) Office

(57) ABSTRACT

A fan control system is provided, which is used for dissipating heat from a computer device. The fan control system includes a control interface and multiple fan modules. Each one of the fan modules includes a controller, a fan, and a sensor. The controller correspondingly controls a rotational speed of the fan according to environment data transmitted by the connected sensor. The controller transmits real-time fan information to the control interface, and the real-time fan information includes the environment data, identification data, wind direction data, and rotational speed data. The control interface receives the real-time fan information transmitted by the fan modules, and the control interface controls at least one of the fans to change a current rotational speed according to operation information and the real-time fan information transmitted by the fan modules. The fan control system allows the computer device to achieve a good heat-dissipation effect.

10 Claims, 6 Drawing Sheets

(56) References Cited

U.S. PATENT DOCUMENTS

| | | | |
|---|---|---|---|
| 2014/0054024 A1 | 2/2014 | Chen et al. | |
| 2015/0147155 A1* | 5/2015 | Duan | F04D 25/0613 |
| | | | 700/275 |
| 2019/0235982 A1* | 8/2019 | North | G06F 1/203 |
| 2019/0297749 A1 | 9/2019 | Bernardin | |
| 2023/0137596 A1* | 5/2023 | Gerdes | G06F 1/206 |
| | | | 361/695 |

FOREIGN PATENT DOCUMENTS

| | | | |
|---|---|---|---|
| CN | 105975029 A | | 9/2016 |
| CN | 107463233 A | | 12/2017 |
| CN | 107642869 A | | 1/2018 |
| CN | 108691795 A | | 10/2018 |
| CN | 111625068 A | | 9/2020 |
| CN | 113377178 A | | 9/2021 |
| CN | 215409344 U | | 1/2022 |
| CN | 115263792 A | * | 11/2022 |
| EP | 2620836 A1 | | 7/2013 |
| TW | 200636413 A | | 10/2006 |
| TW | 200922452 A | | 5/2009 |
| TW | 201327120 A1 | | 7/2013 |
| TW | M457782 U1 | | 7/2013 |

* cited by examiner

FAN CONTROL SYSTEM

CROSS-REFERENCE TO RELATED PATENT APPLICATION

This application claims the benefit of priority to Taiwan Patent Application No. 111130533, filed on Aug. 15, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a fan control system, and more particularly to a fan control system used in a computer system.

BACKGROUND OF THE DISCLOSURE

Only through an additionally installed external interface can fans in existing desktop computers communicate with a central processing unit. Furthermore, the fans used in the existing desktop computers are controlled by an operating system. However, it is difficult for a computer device to achieve a good heat-dissipation effect through such a controlling method.

SUMMARY OF THE DISCLOSURE

In response to the above-referenced technical inadequacies, the present disclosure provides a fan control system for overcoming inconveniences caused by fans used in existing desktop computers. Such fans are not able to communicate with a central processing unit unless an additionally installed external interface is provided.

In one aspect, the present disclosure provides a fan control system, which is used for dissipating heat from a computer device. The fan control system includes a control interface and a plurality of fan modules. The control interface is operated in an operating system of the computer device, and is able to obtain operation information of the operating system. Each one of the fan modules includes a controller, a fan, and one or more sensors. The controller is connected to the control interface. The fan is electrically connected to the controller. The sensor is electrically connected to the controller, and is used to detect an environment state of an environment in which the fan is located, so as to generate environment data. One piece of the environment data indicates a temperature of the environment. The controller correspondingly controls a rotational speed of the fan according to the environment data transmitted by the connected sensor. The controller transmits real-time fan information to the control interface, and the real-time fan information includes the environment data, identification data, wind direction data, and rotational speed data. The wind direction data is used to indicate whether the fan draws external air into the computer device or discharges air out of the computer device. The control interface receives the real-time fan information transmitted by the fan modules, and the control interface controls at least one of the fans to change a current rotational speed according to the operation information and the real-time fan information transmitted by the fan modules.

Therefore, in the fan control system provided by the present disclosure, each one of the fan modules can automatically rotate according to an environment temperature. Further, the control interface can control the rotational speed of at least one of the fan modules according to multiple pieces of the real-time fan information and the operation information transmitted by the operating system. In this way, the computer device can have an improved heat-dissipation effect.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
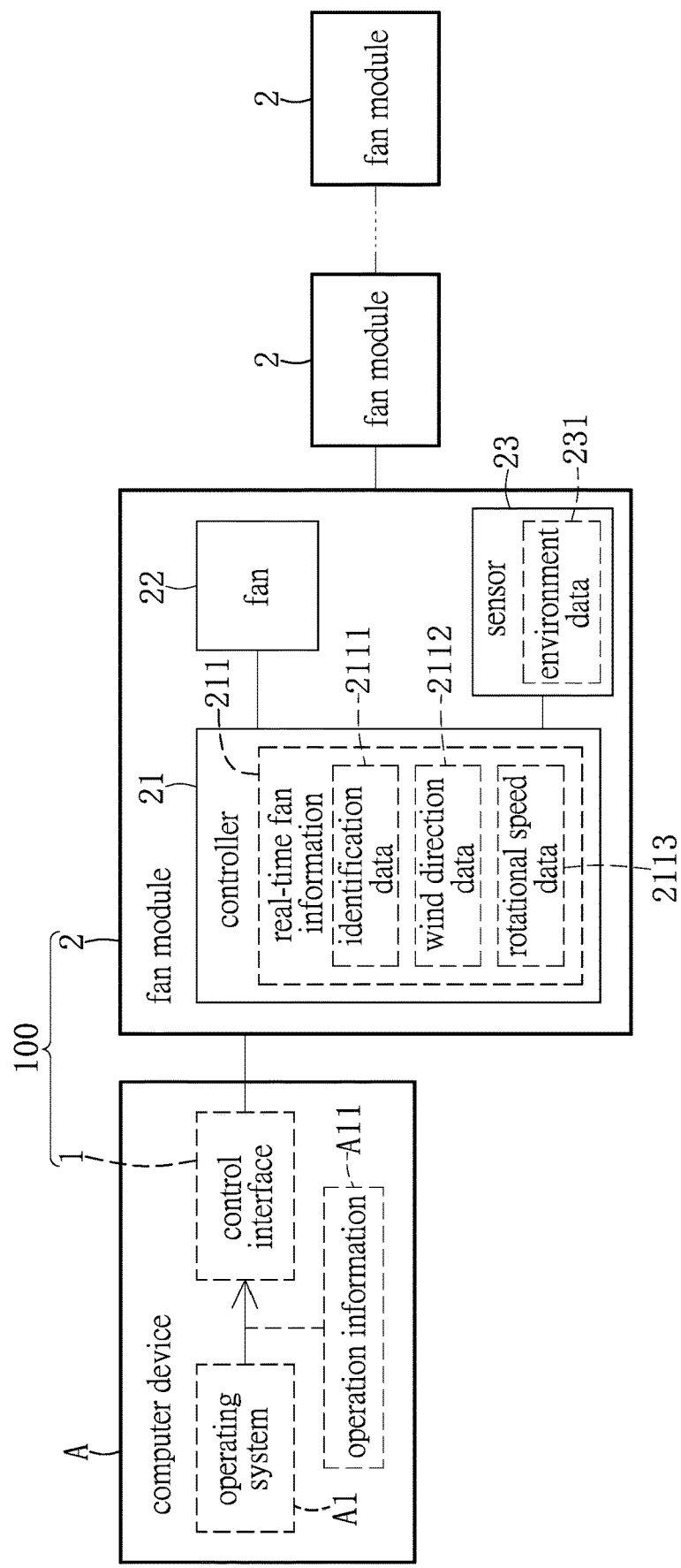
FIG. 1 is a schematic block diagram of a fan control system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a schematic block diagram of a fan control system according to the present disclosure. A fan control system 100 of the present disclosure is used for dissipating heat from a computer device A. The fan control system 100 includes a control interface 1 and a plurality of fan modules 2. The computer device A mentioned herein refers to a desktop computer, and more particularly to a normal-size desktop computer that includes a housing, a motherboard, a power supplier, a hard disk drive, etc.

The control interface 1 is operated in an operating system A1 of the computer device A, and is able to obtain operation information A11 of the operating system A1. For example, the control interface 1 can be presented by way of a web page or an application, but is not limited thereto. The control interface 1 is mainly used for allowing a user to control and view an operation state of each fan module 2. The operation information A11 includes, for example, a name of an application currently executed by the operating system A1, a used memory capacity, a used resource amount of a central processing unit (CPU), and a startup time, an operation duration, and a core temperature of the central processing unit.

Each fan module 2 includes a controller 21, a fan 22, and one or more sensors 23. The controller 21 and the sensor 23 are disposed on a frame of the fan 22, and the controller 21 is connected to the control interface 1. For example, the controller 21 can be connected to the computer device A in a wired or wireless manner, and the controller 21 transmits relevant information with the control interface 1 through the computer device A. The fan 22 is electrically connected to the controller 21, and the controller 21 can control the fan 22 to turn on or turn off. In addition, the controller 21 can control a rotational speed of the fan 22.

The sensor 23 is electrically connected to the controller 21. The sensor 23 is used to detect an environment state of an environment in which the fan 22 is located, so as to generate environment data 231. One piece of the environment data 231 indicates a temperature of the environment. In one practical application, not only can the sensor 23 be used to detect an environment temperature, but the sensor 23 can also be used to detect a humidity of the environment in which the fan 22 is located. As such, two pieces of the environment data 231 generated by the sensor 23 are the temperature and the humidity, respectively. In different embodiments, a quantity of the sensors 23 included in each fan module 2 can be two, and the two sensors 23 are respectively used to detect the temperature and the humidity of a surrounding environment.

The controller 21 correspondingly controls the rotational speed of the fan 22 according to the environment data 231 transmitted by the connected sensor 23. That is to say, the controller 21 included in the fan module 2 can directly use the environment data 231 transmitted by the sensor 23 included in the fan module 2 to control the rotational speed of the fan 22 in real time. Independent of the computer device A or computation and judgment of other relevant devices, each fan module 2 is able to change the rotational speed of the fan 22 simply based on the temperature of the environment (i.e., the environment data 231).

For example, when the controller 21 determines that the temperature of the environment in which the fan 22 is located exceeds a predetermined temperature according to the environment data 231 transmitted by the connected sensor 23, the controller 21 can directly control the connected fan 22 to be turned on and rotate at a predetermined rotational speed. Or, the controller 21 can control the fan 22 to increase a current rotational speed to the predetermined rotational speed. That is, after the fan module 2 is connected to a relevant power source, the fan module 2 automatically starts rotating at the predetermined rotational speed when the environment temperature exceeds the predetermined temperature.

Moreover, when the controller 21 determines that the humidity of the environment in which the fan 22 is located exceeds a predetermined humidity according to the environment data 231 transmitted by the connected sensor 23, the controller 21 can directly control the connected fan 22 to be turned on and rotate at the predetermined rotational speed. Or, the controller 21 can control the fan 22 to increase the current rotational speed to the predetermined rotational speed.

Conversely, after the controller 21 of the fan module 2 controls the fan 22 to rotate at the predetermined rotational speed for a predetermined duration, the controller 21 can determine again whether or not the temperature or the humidity of the environment in which the fan 22 is located is lower than the predetermined temperature or the predetermined humidity according to the environment data 231. If the controller 21 determines that the temperature or the humidity of the environment in which the fan 22 is located is lower than the predetermined temperature or the predetermined humidity, the controller 21 can control the fan 22 to stop rotating, or the controller 21 can control the fan 22 to decrease the current rotational speed such that the fan 22 no longer rotates at the predetermined rotational speed.

The controller 21 can also transmit real-time fan information 211 to the control interface 1, and the real-time fan information 211 includes the environment data 231, identification data 2111, wind direction data 2112, and rotational speed data 2113. The identification data 2111 is provided for allowing the control interface 1 to identify from which fan module 2 the current real-time fan information 211 is emitted. For example, the identification data 2111 can be a unique serial number or code. The wind direction data 2112 is used to indicate whether the fan 22 draws external air into the computer device A or discharges air out of the computer device A.

The control interface 1 can receive the real-time fan information 211 transmitted by the fan modules 2, and the control interface 1 controls at least one of the fans 22 to change the current rotational speed according to the operation information A11 and the real-time fan information 211 transmitted by the fan modules 2.

For example, through receipt of multiple pieces of the real-time fan information 211, the control interface 1 has learned that one of the fan modules 2 has automatically started rotating at the predetermined rotational speed due to the temperature of the environment exceeding 60° C. (i.e., the predetermined temperature, but specific values are not limited thereto). In addition, through the operation information A11, the control interface 1 has learned that the operating system A1 begins to execute an application (e.g., a high-quality 3D game, a 3D graphics software, and a video/audio editing software) that uses up a considerable amount of computing resources. Under this circumstance, the control interface 1 can control at least one of the remaining fan modules 2 to start rotating. In this way, when the user frequently operates said application, a temperature within the housing does not increase in a drastic manner.

In the above-mentioned use scenario, if the control interface 1 does not first control the remaining fan modules 2 to start rotating according to the operation information A11, the temperature within the housing may drastically increase when the user begins to frequently operate said application. Afterwards, although the remaining fan modules 2 may rotate in an automatic manner, a relatively longer length of time is needed for effectively discharging heat energy within the housing. Furthermore, there is an issue of relevant components not being operable due to a high temperature.

In a different scenario, through receipt of multiple pieces of the real-time fan information 211, the control interface 1 learns that none of the fan modules 2 are in operation at a present time. In addition, through the operation information A11, the control interface 1 learns that the operating system A1 begins to execute the application that uses up a considerable amount of computing resources. Under this circumstance, the control interface 1 can first control at least one of the fan modules 2 to start rotating (e.g., starting to rotate at a relatively lower rotational speed).

Based on the above, it should be noted that while the fan modules 2 each include the controller 21 and the sensor 23, the fan modules 2 are not able to obtain the current operation information A11 of the operating system A1. Hence, rotation of the fan modules 2 cannot start before the operating system A1 begins to execute the application that uses up a considerable amount of computing resources. However, the control interface 1 can obtain the real-time fan information 211 of each fan module 2 and the operation information A11. As such, when the control interface 1 determines that the operating system A1 has begun execution of the application that uses up a considerable amount of computing resources but the temperature within the housing has not yet exceeded the predetermined temperature, the control interface 1 can in advance control at least one of the fan modules 2 to rotate.

That is to say, the controller 21 of each fan module 2 can automatically control the rotational speed of the fan 22 according to the environment data 231 transmitted by the sensor 23. In addition, the control interface 1 can also change the rotational speed of at least one of the fan modules 2 according to the operation information A11 obtained by the operating system A1. Accordingly, the temperature within the housing can be better controlled.

In one exemplary embodiment, when the controller 21 determines that the temperature of the environment in which the fan module 2 is located exceeds the predetermined temperature according to the environment data 231, the controller 21 controls a corresponding one of the fans 22 to rotate at a first rotational speed. When one of the fan modules 2 is rotating at the first rotational speed, the control interface 1 can control, according to the real-time fan information 211 transmitted by each fan module 2 and the operation information A11, at least another one of the fan modules 2 adjacent to the one of the fan modules 2 that is rotating at the first rotational speed to rotate at a second rotational speed. The second rotational speed is less than the first rotational speed. In one specific application, the noise generated by the fan module 2 that rotates at the second rotational speed is less than the noise generated by the fan module 2 that rotates at the first rotational speed. However, the present disclosure is not limited thereto.

In another embodiment, the fan module 2 that is controlled by the control interface 1 according to the operation information A11 and the real-time fan information 211 is defined as a controlled fan. After the controlled fan is controlled by the control interface 1 to change the current rotational speed for a predetermined duration, the control interface 1 obtains multiple pieces of the real-time fan information 211 again, and the control interface 1 determines whether or not the temperature detected by the sensor 23 of each fan module 2 exceeds the predetermined temperature.

If the control interface 1 determines that the temperature detected by the sensor 23 of each fan module 2 is lower than the predetermined temperature, the control interface 1 controls the controlled fan to stop rotating or decrease the rotational speed. If the control interface 1 determines that the temperature detected by the sensor 23 of any one of the fan modules 2 exceeds the predetermined temperature, the control interface 1 controls the controlled fan to continue rotating or increase the rotational speed, and further controls another one of the fan modules 2 that does not rotate at the predetermined rotational speed to rotate. Alternatively, the control interface 1 controls the controlled fan to rotate at the predetermined rotational speed, or controls the fan module 2 that does not rotate to start rotating.

For example, three fan modules are disposed in the housing, and these three fan modules are defined as a first fan module, a second fan module, and a third fan module, respectively. When a controller of the first fan module determines that the temperature of the surrounding environment exceeds the predetermined temperature, and a fan of the first fan module rotates at the predetermined rotational speed, the control interface 1 can learn that the first fan module is currently rotating at the predetermined rotational speed according to three pieces of the real-time fan information 211. At the same time, if the control interface 1 learns from the operation information A11 that the operating system A1 is currently executing the application that uses up a considerable amount of computing resources, the control interface 1 can control the second fan module (i.e., the controlled fan) to rotate at a relatively lower rotational speed.

After the control interface 1 controls the second fan module to operate for ten minutes (i.e., a predetermined duration, which is merely provided as an example and is not limited thereto), the control interface 1 can once again determine whether or not the temperature of the environment in which each fan module is located is lower than the predetermined temperature according to the three pieces of the real-time fan information 211. If the control interface 1 determines that the temperature of the environment in which each fan module is located is already lower than the predetermined temperature (at this time, the controller of the first fan module will control the fan not to rotate at the predetermined rotational speed), the control interface 1 can control the second fan module to stop rotating or decrease the rotational speed.

Conversely, if the control interface 1 determines that the temperature of the environment in which the first fan module is located still exceeds the predetermined temperature according to the three pieces of the real-time fan information 211, the control interface 1 can control the second fan module to continue rotating or increase the rotational speed, and further controls the third fan module to start rotating.

Based on the above, after the control interface 1 controls one of the fan modules 2 to rotate for a predetermined duration, the control interface 1 determines a temperature state of the environment in which each fan module 2 is located through multiple pieces of the real-time fan information 211, so as to decide whether to stop the controlled fan from rotating or decrease the rotational speed of the controlled fan. In other words, when the control interface 1 controls any one of the fan modules 2 to rotate according to multiple pieces of the real-time fan information 211 and the operation information A11, the control interface 1 can first control said fan module 2 to operate for the predetermined duration. Then, the control interface 1 once again decides whether or not to adjust the rotational speed of said fan module 2 according to multiple pieces of the real-time fan information 211 and the operation information A11.

In summary, through a plurality of fan modules being configured to include a controller and a sensor and through cooperation with a control interface and operation information, the fan control system of the present disclosure can effectively control the temperature within the housing. Accordingly, occurrences of a thermal shutdown in a computer can be significantly reduced.

Figure 2:
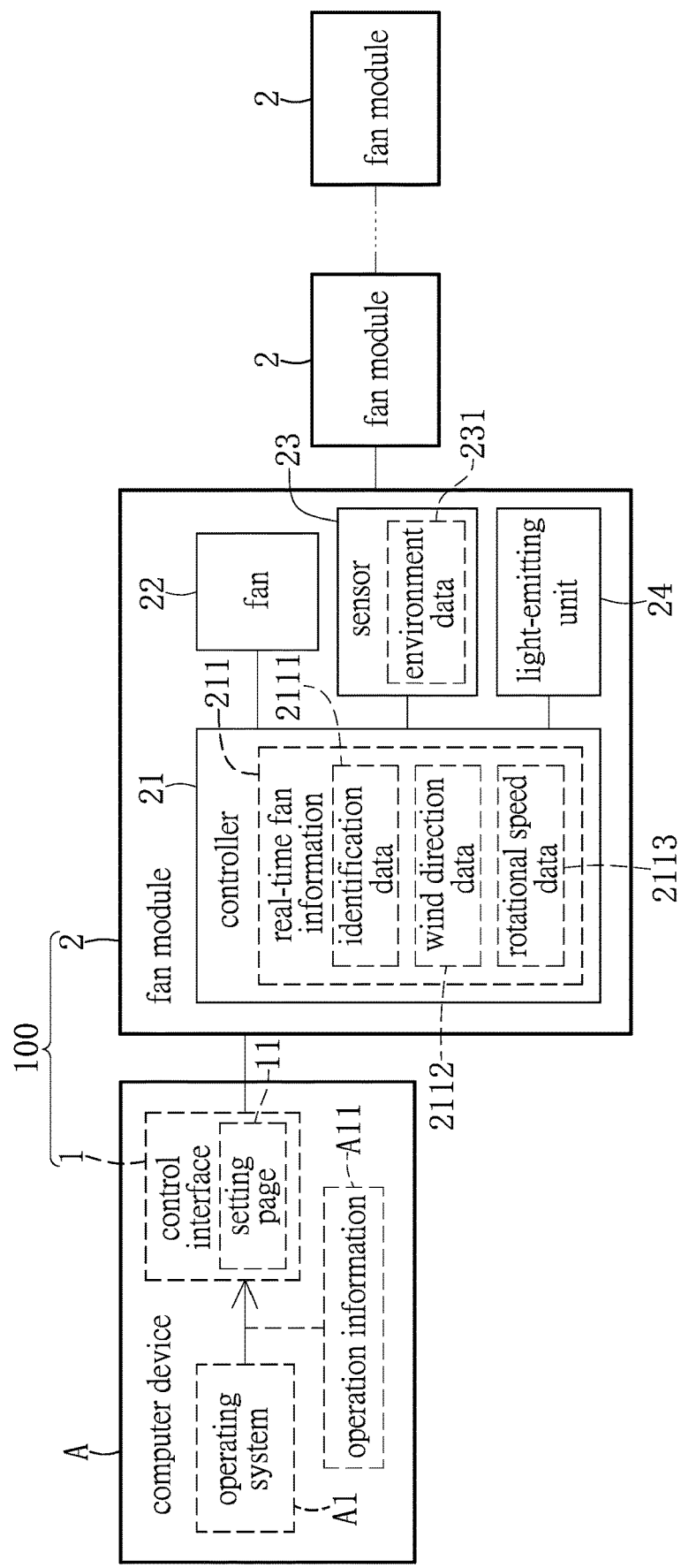
FIG. 2 is a schematic block diagram of the fan control system according to a second embodiment of the present disclosure.
Figure 3:
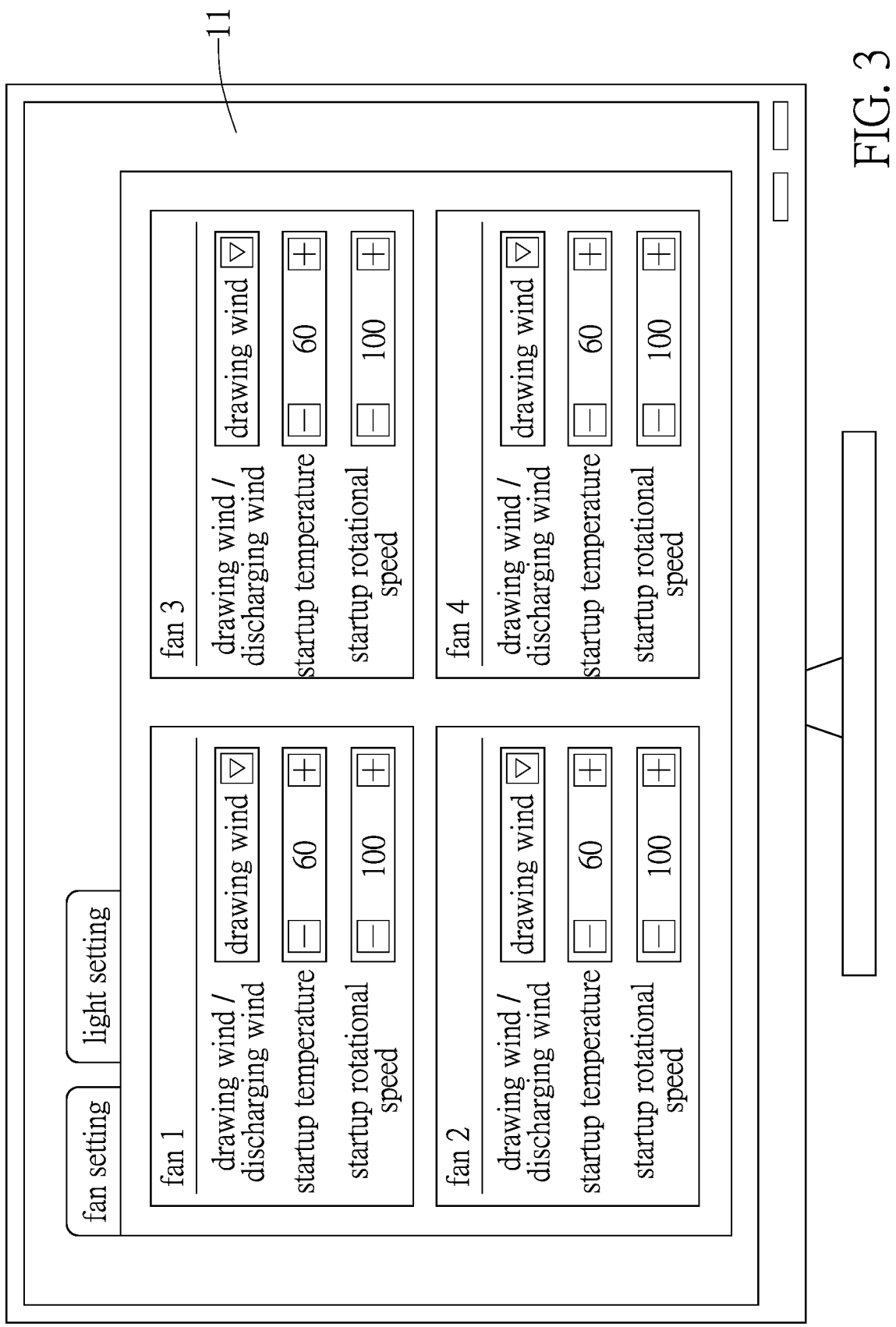
FIG. 3 is a schematic view showing a setting page of the fan control system according to the second embodiment of the present disclosure.

Reference is made to FIG. 2 and FIG. 3. FIG. 2 is a schematic block diagram of the fan control system according to a second embodiment of the present disclosure, and FIG. 3 is a schematic view showing a setting page of the fan control system according to the second embodiment of the present disclosure.

One of the differences between the present embodiment and the previous embodiment is that each fan module 2 further includes one or more light-emitting units 24, and the light-emitting unit 24 is electrically connected to the controller 21. The controller 21 controls a color of a light beam emitted by the light-emitting unit 24 according to the environment data 231. Alternatively, the controller 21 can control the color of the light beam emitted by the light-emitting unit 24 according to the current rotational speed of the fan 22.

For example, when the controller 21 determines that the temperature of the environment in which the fan 22 is located exceeds the predetermined temperature according to the environment data 231, the controller 21 controls the light-emitting unit 24 to emit a red light. Conversely, the light-emitting unit 24 is controlled to emit a blue light. The controller 21 may also control the light-emitting unit 24 to emit the red light when the fan 22 is rotating at a high speed, and to emit the blue light when the fan 22 is rotating at a low speed.

Based on the above, the controller 21 can control the light-emitting unit 24 to emit a light beam having a color that corresponds to the environment data 231 generated by the sensor 23 and the current rotational speed of the fan 22. Thus, related personnel are able to determine the temperature state of the environment in which each fan module 2 is located by directly observing the color of the light beam currently emitted by each fan module 2, so that a heat-dissipation state of the computer device A can be better managed.

For example, if the controller 21 can not only increase the rotational speed of the fan 22 but also control the light-emitting unit 24 to emit the red light when the temperature of the environment in which the fan 22 is located exceeds the predetermined temperature (according to the environment data 231), the user is allowed to determine in real time if the computer device A has experienced an abnormality by observing whether or not each fan module 2 has continuously emitted the red light for some time. In this way, relevant applications of the computer device A can be closed at an earlier time, so as to prevent relevant electronic components of the computer device A from being damaged due to the high temperature.

That is to say, the light-emitting unit 24 included in each fan module 2 not only allows the user to have a better visual experience but also allows the user to determine the current temperature of the environment in which each fan module 2 is located in a faster and easier manner, so that the user can close some of the applications that are running in the computer device A in real time. Accordingly, a load of the computer device A can be reduced.

Referring to FIG. 3, another one of the differences between the present embodiment and the previous embodiment is that the control interface 1 further has a setting page 11, and the setting page 11 is provided for the user to alter the predetermined temperature and the predetermined rotational speed of any one of the fan modules 2. That is to say, according to an inner area of the housing of the actual computer device A and practical requirements, the related personnel can use the setting page 11 to set the rotational speed at which any one of the fan modules 2 rotates when the temperature or the humidity of its surroundings reaches a certain value.

It is worth mentioning that the setting page 11 is also provided for the user to input the wind direction data 2112 of each fan module 2. Specifically, the fan modules 2 may be disposed at different positions of the housing of the computer device A. While some of the fan modules 2 are used to discharge the air out of the computer device A, other ones of the fan modules 2 are used to draw air outside the computer device A into the computer device A. Therefore, the fans 22 of the different fan modules 2 need to start operation under different temperature conditions, so that heat energy generated during operation of the computer device A can be discharged in a rapid and effective manner.

Further, the setting page 11 can be provided for the user to alter the color of the light beam emitted by the light-emitting unit 24 of any one of the fan modules 2 at different temperature ranges, and the different temperature ranges are detected by the sensor 23. For example, through the setting page 11, the user can set the light-emitting unit 24 of any one of the fan modules 2 to emit a blue light beam when the temperature detected by the corresponding sensor 23 is lower than 25° C. An orange light beam is emitted when the temperature detected by the sensor 23 ranges between 30° C. and 35° C., and a red light beam is emitted when the temperature detected by the sensor 23 exceeds 60° C.

It should be noted that, while each fan module 2 is configured to include the light-emitting unit 24 and the control interface 1 is configured to have the setting page 11 in the present embodiment, these two configurations are not limited to being applied in the fan control system 100 at the same time.

Figure 4:
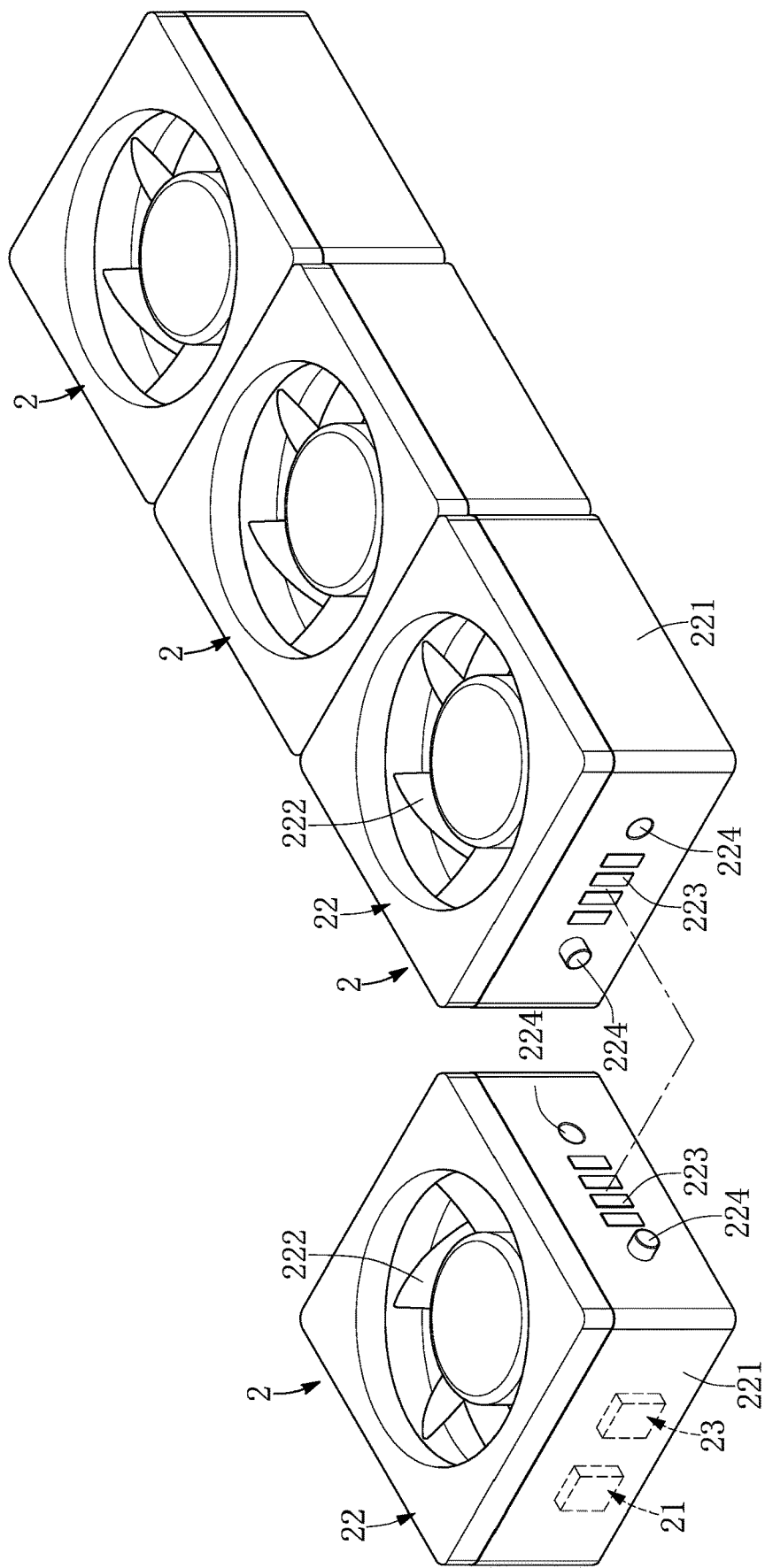
FIG. 4 is a schematic view of fan modules of the fan control system according to a third embodiment of the present disclosure.

Reference is made to FIG. 4, which is a schematic view showing each fan module of the fan control system according to a third embodiment of the present disclosure. In practice, each fan 22 includes a frame 221, a fan blade structure 222, an electrical connection structure 223, and one or more side connection structures 224. The fan blade structure 222 is rotatably disposed in the frame 221, and the electrical connection structure 223 and the side connection structure 224 are disposed on one side of the frame 221. The controller 21 and the sensor 23 are disposed on the frame 221.

The side connection structure 224 of one of the fans 22 is engaged with the side connection structure 224 of another one of the fans 22, and an electrical connection is formed between the two electrical connection structures 223 of the two fans 22 that are engaged with each other. Through the electrical connection structures 223, the controllers 21 of the two fan modules 2 that are connected to each other are able to pass on the real-time fan information 211.

Specifically, one of the multiple fan modules 2 that are connected to each other can be connected to the motherboard (i.e., a mainboard) of the computer device A through an electrical connection wire (e.g., different USB cables and cables) or the electrical connection structure 223 thereof, and obtain electric power from a power supply device (e.g., the power supplier of the computer device A). The remaining ones of the fan modules 2 can obtain the electric power that is required for operation through the electrical connection structures 223, and transmit the real-time fan information 211 to the motherboard. The central processing unit on the motherboard can transmit the real-time fan information 211 to the control interface 1.

That is to say, the user can easily manipulate the two side connection structures 224 on the frames 221 of the two fan modules 2 to be engaged with each other, such that the two fan modules 2 are arranged side by side and electrically connected to each other.

In the drawing of the present embodiment, the two side connection structures 224 included in the two fan modules 2 that are engaged with each other are exemplified as being a convex column and a groove structure, respectively. However, a specific size, an outer appearance, and a placement position of the side connection structure 224 included in each fan module 2 are not limited to those shown in the drawing. For example, in different embodiments, the two side connection structures 224 included in the two fan modules 2 that are engaged with each other can also be a rectangular protruding structure and a rectangular sliding groove, respectively. When the related personnel disassemble the two fan modules 2, the rectangular protruding structure is able to slide within the rectangular sliding groove.

It should be noted that as long as the two fan modules 2 can be so arranged as to be engaged or not engaged with each other, the specific outer appearance, structure, and size of the side connection structures 224 included in the two fan modules 2 can be designed according to practical requirements.

In practice, the electrical connection structure 223 of the fan 22 can be, for example, different pogo pins and multiple metal connection points. However, the present disclosure is not limited thereto. In one particular application, the electrical connection structure 223 can also be a relevant connector (e.g., a USB connector).

Figure 5:
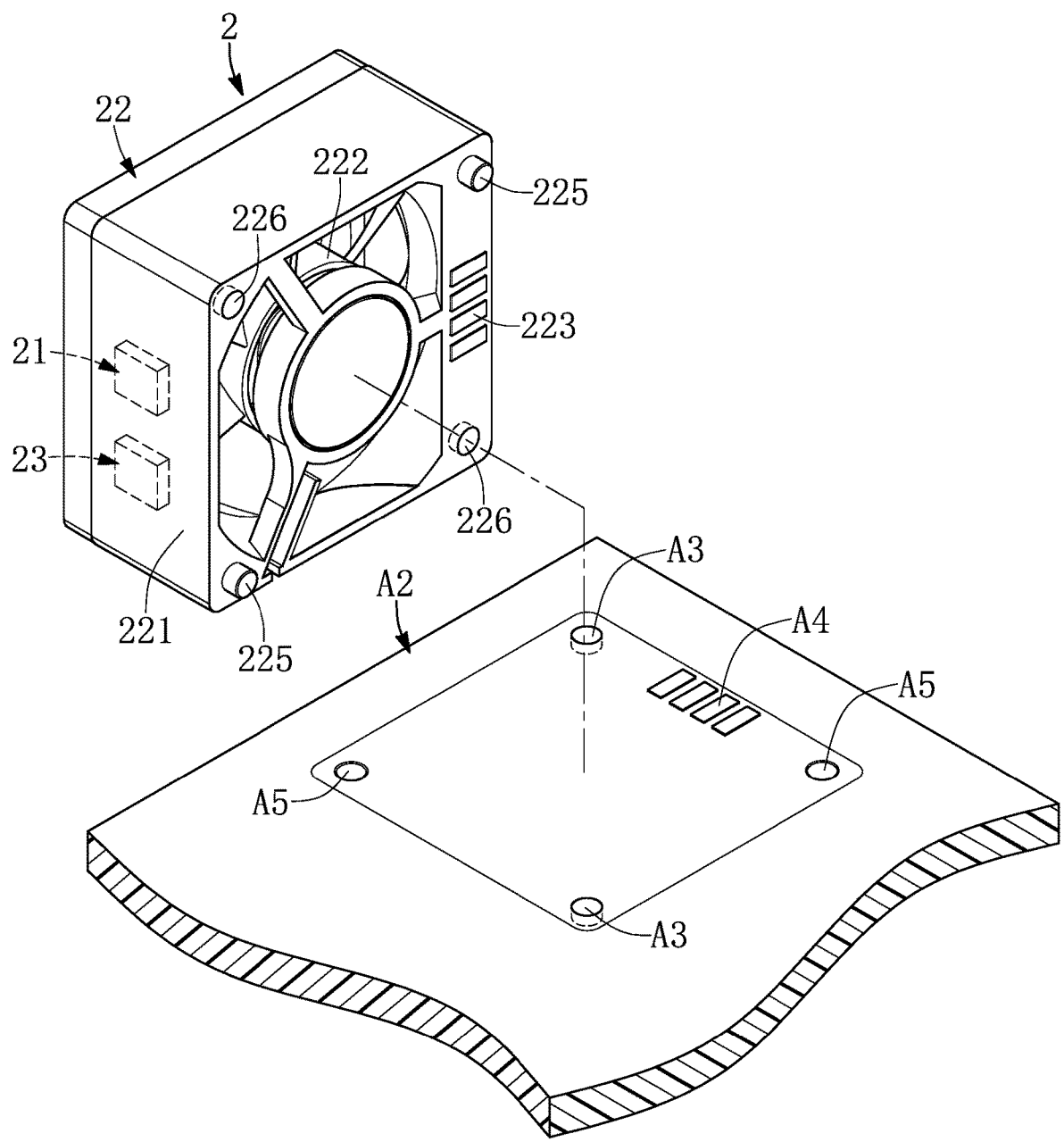
FIG. 5 is a schematic exploded view showing a motherboard of a computer device and the fan module of the fan control system according to a fourth embodiment of the present disclosure.

Reference is made to FIG. 5, which is a schematic exploded view showing a motherboard of a computer device and the fan module of the fan control system according to a fourth embodiment of the present disclosure. Each fan module 2 includes the frame 221, the fan blade structure 222, the electrical connection structure 223, one or more assembly structures 225, and one or more magnet units 226. The fan blade structure 222 is rotatably disposed in the frame 221, and the assembly structure 225 and the electrical connection structure 223 are disposed on one side of the frame 221.

The magnet units 226 of the fan module 2 cooperate with a plurality of magnet units A3 of a motherboard A2 (i.e., a mainboard) of the computer device A, so that the fan module 2 is disposed at a predetermined position of the motherboard A2. Further, the fan module 2 is detachably fixed to the predetermined position of the motherboard A2 through the assembly structure 225. One of the two corresponding magnetic units 226, A3 can be a strong magnet, and another one of which can be a structural member that is attracted to a magnet.

When the fan module 2 is fixed to the predetermined position of the motherboard A2 through engagement of the assembly structure 225 and an assembly structure A5 of the motherboard A2, the electrical connection structure 223 is connected to an electrical connection structure A4 of the motherboard A2, and the controller 21 is able to communicate with a central processing unit on the motherboard A2 through the electrical connection structure 223. Accordingly, the control interface 1 can obtain the real-time fan information 211 transmitted by the controller 21. Moreover, the controller 21 can obtain the electric power that is required for operation through the electrical connection structures 223, A4.

For example, the assembly structure 225 included in the fan module 2 can be a structure in a columnar shape, and the assembly structure A5 of the motherboard A2 can be a groove in a columnar shape. The structure in the columnar shape can be engaged with the groove in the columnar shape. An outer appearance, a size, and a placement position of the assembly structures 225, A5 are not limited to those shown in the drawing.

In practice, the electrical connection structure 223 of the fan 22 can be, for example, different pogo pins and multiple metal connection points. However, the present disclosure is not limited thereto. In one particular application, the electrical connection structure 223 can also be a relevant connector (e.g., a USB connector).

Figure 6:
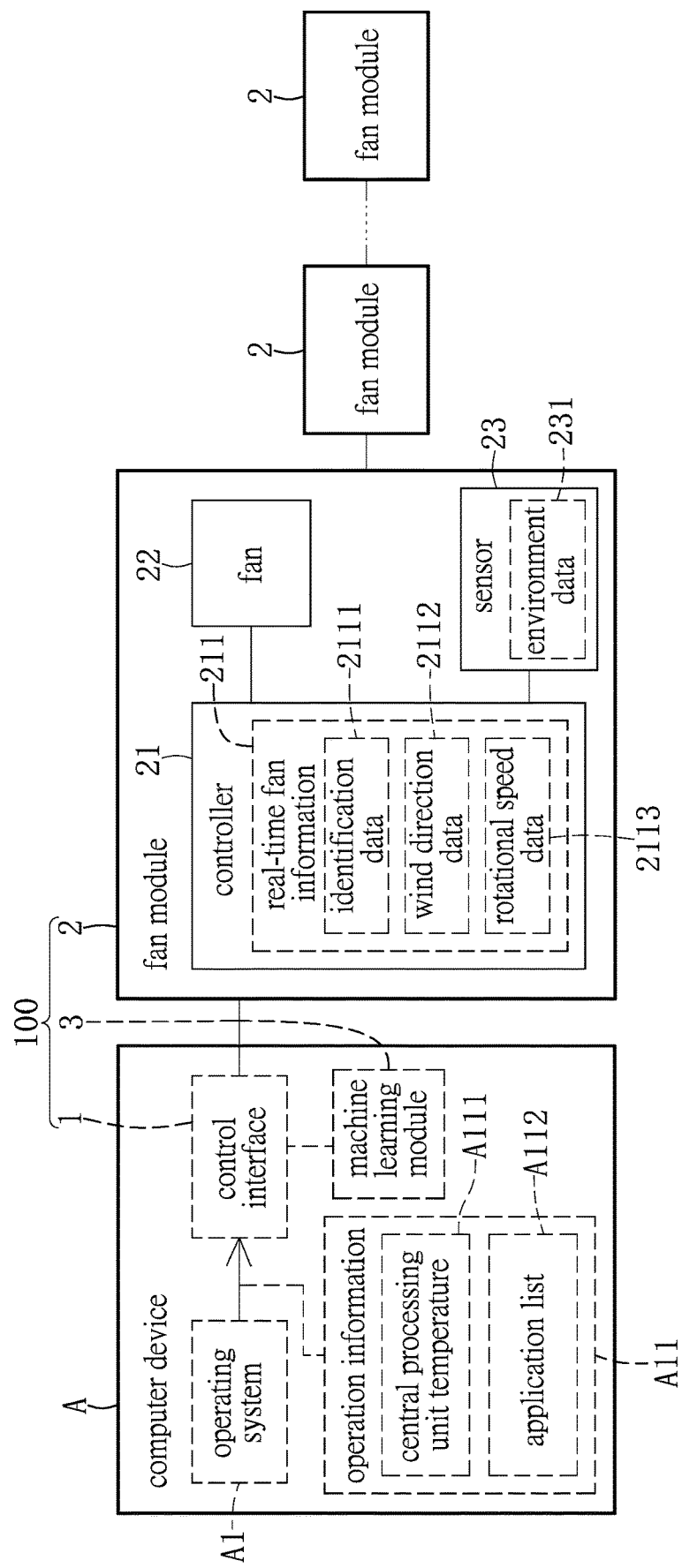
FIG. 6 is a schematic block diagram of the fan control system according to a fifth embodiment of the present disclosure.

Reference is made to FIG. 6, which is a schematic block diagram of the fan control system according to a fifth embodiment of the present disclosure. The main difference between the present embodiment and the previous embodiment is that the fan control system 100 further includes a machine learning module 3, and the control interface 1 can transmit the received real-time fan information 211 and the corresponding operation information A11 to the machine learning module 3 for training.

The operation information A11 at least includes a central processing unit temperature A111 of the computer device A and an application list A112 that is currently executed by the computer device A, but is not limited thereto. In different embodiments, the operation information A11 can also include a startup time for execution of each application, an operation duration of each application, a number of times that each application reads the hard disk drive, a used memory capacity of each application, a percentage of each application in using resources of the central processing unit, etc. In practice, the control interface 1 can, for example, obtain the operation information A11 from the operating system A1 every predetermined interval of time (e.g., every minute).

Through using a machine learning algorithm, the machine learning module 3 calculates the rotational speed at which the fan 22 of each fan module 2 should rotate when the computer device A executes the applications in the application list A112, so that a temperature of the central processing unit of the computer device A is maintained at a target temperature. When the control interface 1 determines that the computer device A is executing the applications in the application list A112 according to the operation information A11, the control interface 1 can control the fan 22 of the corresponding fan module 2 to rotate at the corresponding rotational speed according to suggestions made by the machine learning module 3.

More specifically, the user may open different applications at different time points. Even if the user opens exactly the same applications, since operation frequencies of each application may not be exactly the same, the temperature within the housing for each time differs. In view of this, by transmitting the real-time fan information 211 and the corresponding operation information A11 to the machine learning module 3 for training, the machine learning module 3 can predict a possible temperature of the housing within a following period of time based on the applications that are currently running in operating system A1.

That is to say, when the machine learning module 3 is included in the fan control system 100, the machine learning module 3 can calculate, according to multiple pieces of the operation information A11 and multiple pieces of the real-time fan information 211, a possible temperature of the central processing unit and the possible temperature within the housing when the computer device A is executing a specific application (or specific applications). On this basis, which fan (or fans) 22 needs to rotate at what speed when the computer device A is executing the specific application (or the specific applications) for a specific period of time can be determined. Accordingly, the temperature of the central processing unit (or the temperature within the housing) can be kept at the target temperature, or the temperature of the central processing unit can be rapidly decreased to an appropriate temperature when the computer device A is no longer executing the specific application (or the specific applications).

For example, according to multiple pieces of the operation information A11 and multiple pieces of the real-time fan information 211 in the past, the machine learning module 3 calculates that the temperature of the central processing unit and the temperature within the housing will increase to 60° C. when the operating system A1 simultaneously executes two specific ones of the applications for thirty minutes. As a result, when the machine learning module 3 receives the operation information A11 and multiple pieces of the real-time fan information 211 transmitted by the control interface 1 in real time and determines that the operating system A1 has begun executing the two specific ones of the applications, the machine learning module 3 can provide the following suggestions to the control interface 1: controlling each fan module 2 to start rotating at a relatively lower rotational speed, and after two to twenty minutes, controlling each fan module 2 to start rotating at the predetermined rotational speed.

Moreover, according to multiple pieces of the operation information A11 and multiple pieces of the real-time fan information 211 in the past, the machine learning module 3 can calculate a use habit of the user for each application and a corresponding temperature change of the central processing unit, so as to provide corresponding suggestions. For example, through multiple pieces of the operation information A11 and multiple pieces of the real-time fan information 211 in the past, the machine learning module 3 comes to a conclusion that an image editing application will be frequently operated for half an hour to one hour by the user each time after said application is opened for about five minutes. Afterwards, said application will not be operated for about thirty minutes before being frequently operated for one hour again. The temperature within the housing is likely to reach the predetermined temperature thirty minutes after the image editing application is opened. Therefore, when the machine learning module 3 receives the operation information A11 and multiple pieces of the real-time fan information 211 transmitted by the control interface 1 in real time and determines that the operating system A1 has begun executing the image editing application, the machine learning module 3 can provide the following suggestions to the control interface 1: controlling each fan module 2 to start rotating at a relatively lower rotational speed, and after two to five minutes, controlling each fan module 2 to start rotating at the predetermined rotational speed.

In other words, the machine learning module 3 allows the fan modules 2 to automatically control the rotational speed of the fans 22 by means other than the controllers 21 included therein. Further, according to the current operation information A11 of the computer device A and the suggestions made by the machine learning module 3, the control interface 1 can better control operation of each fan module 2. In this way, the heat energy generated during operation of the computer device A can be better discharged, and a situation in which the central processing unit stops execution of the application (as a protective measure) due to the environment temperature exceeding the predetermined temperature can be significantly improved.

It is worth mentioning that, during use of the computer device A, the user may download new applications, update the applications, or update an operating system from time to time. Hence, through the configuration of the machine learning module 3, the control interface 1 can better control operation of each fan module 2, such that the computer device A can have a good heat-dissipation effect at any time.

In one specific application, the machine learning module 3 can be, for example, a machine learning chip that is assembled to one of the fan modules 2. However, the present disclosure is not limited thereto. The machine learning module 3 can also be integrated with the control interface 1 as one application. Such an application can be, for example, a web page or an application that is installed in the computer device, but is not limited thereto.

In conclusion, in the fan control system provided by the present disclosure, each fan module is configured to include the controller and the sensor, so that the fan module can automatically change the rotational speed of the fan according to the temperature of the environment in which the fan module is located. Further, the control interface is configured to receive real-time fan information of each fan module and the operation information of the operating system, so that the rotational speed of each fan can be better controlled according to a current operation status of the computer device. Accordingly, during operation, the computer device can have an improved heat-dissipation effect.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A fan control system, which is used for dissipating heat from a computer device, the fan control system comprising:

a control interface, wherein the control interface is operated in an operating system of the computer device, and is able to obtain operation information of the operating system; and
a plurality of fan modules, wherein each one of the fan modules includes:
a controller connected to the control interface;
a fan electrically connected to the controller; and
one or more sensors electrically connected to the controller, wherein the sensor is used to detect an environment state of an environment in which the fan is located, so as to generate environment data; wherein one piece of the environment data indicates a temperature of the environment;
wherein the controller correspondingly controls a rotational speed of the fan according to the environment data transmitted by the connected sensor;
wherein the controller transmits real-time fan information to the control interface, and the real-time fan information includes the environment data, identification data, wind direction data, and rotational speed data; wherein the wind direction data is used to indicate whether the fan draws external air into the computer device or discharges air out of the computer device;
wherein the control interface receives the real-time fan information transmitted by the fan modules, and the control interface controls at least one of the fans to change a current rotational speed according to the operation information and the real-time fan information transmitted by the fan modules;
wherein the operation information includes a name of an application currently executed by the operating system, a used memory capacity, a used resource amount of a central processing unit, and a startup time, an operation duration, and a core temperature of the central processing unit of the computer device.

2. The fan control system according to claim 1, wherein a quantity of the sensors included in each one of the fan modules is at least two, one of the at least two sensors is used to detect the temperature of the environment in which the fan is located, and another one of the at least two sensors is used to detect a humidity of the environment in which the fan is located; wherein, when the controller determines that the temperature or the humidity of the environment in which the fan is located exceeds a predetermined temperature or a predetermined humidity according to the environment data generated by the at least two sensors, the controller controls the fan to increase the rotational speed.

3. The fan control system according to claim 1, wherein each one of the fan modules further includes one or more light-emitting units, and the light-emitting unit is electrically connected to the controller; wherein the controller controls at least one of the light-emitting units to change a color of a light beam emitted by the at least one of the light-emitting units according to at least one of the environment data and the rotational speed data.

4. The fan control system according to claim 3, wherein the control interface has a setting page, and the setting page is provided for a user to alter the color of the light beam emitted by the light-emitting unit of any one of the fan modules at different temperature ranges; wherein the different temperature ranges are detected by the sensor.

5. The fan control system according to claim 1, wherein each one of the fans includes a frame, a fan blade structure, one or more side connection structures, and an electrical connection structure, the fan blade structure is rotatably disposed in the frame, and the side connection structure and the electrical connection structure are disposed on one side of the frame; wherein the side connection structure of one of the fans is engaged with the side connection structure of another one of the fans, an electrical connection is formed between the two electrical connection structures of the two fans that are engaged with each other, and the controllers of the fan modules that are electrically connected to each other are able to transmit the real-time fan information to each other; wherein at least one of the fan modules obtains electric power from a power supply device through an electrical connection wire or the electrical connection structure thereof, and remaining ones of the fan modules obtain the electric power that is required for operation through the electrical connection structures.

6. The fan control system according to claim 1, wherein at least one of the fan modules includes a frame, a fan blade structure, one or more assembly structures, a plurality of magnet units, and an electrical connection structure, the fan blade structure is rotatably disposed in the frame, and the assembly structure and the electrical connection structure are disposed on one side of the frame; wherein the magnet units of the fan module cooperate with a plurality of magnet units of a motherboard of the computer device, so that the fan module is disposed at a predetermined position of the motherboard; wherein the fan module is detachably fixed to the predetermined position of the motherboard through the assembly structure; wherein, when the fan module is fixed to the predetermined position through the assembly structure, the electrical connection structure of the fan module is connected to an electrical connection structure of the motherboard, the controller is able to communicate with a central processing unit on the motherboard through the electrical connection structures, and the controller obtains electric power that is required for operation through the electrical connection structures.

7. The fan control system according to claim 1, wherein the controller determines, according to the environment data, whether or not the temperature of the environment in which the connected fan is located exceeds a predetermined temperature; wherein, in response to the controller determining that the temperature of the environment in which the fan is located exceeds the predetermined temperature, the controller controls the fan to rotate at a predetermined rotational speed; wherein the control interface has a setting page, and the setting page is provided for a user to alter the predetermined temperature and the predetermined rotational speed of any one of the fan modules.

8. The fan control system according to claim 1, wherein the controller determines, according to the environment data, whether or not the temperature of the environment in which the connected fan is located exceeds a predetermined temperature; wherein, in response to the controller determining that the temperature of the environment in which the fan is located exceeds the predetermined temperature, the controller controls the fan to rotate at a predetermined rotational speed; wherein the fan module that is controlled by the control interface according to the operation information and the real-time fan information is defined as a controlled fan; wherein, after the controlled fan is controlled by the control interface to change the current rotational speed for a predetermined duration, the control interface obtains multiple pieces of the real-time fan information again, and the control interface determines whether or not the temperature detected by the sensor of each one of the fan modules exceeds the predetermined temperature; wherein, in response to the control interface determining that the temperature detected by the sensor of each one of the fan modules is lower than the predetermined temperature, the control interface controls the controlled fan to stop rotating or decrease the rotational speed; wherein, in response to the control interface determining that the temperature detected by the sensor of any one of the fan modules exceeds the predetermined temperature, the control interface controls the controlled fan to continue rotating or increase the rotational speed, and further controls another one of the fan modules that does not rotate at the predetermined rotational speed to rotate.

9. The fan control system according to claim 1, wherein the controller determines, according to the environment data generated by the connected sensor, whether or not the temperature of the environment in which the fan module is located exceeds a predetermined temperature; wherein, in response to the controller determining that the temperature of the environment in which the fan module is located exceeds the predetermined temperature, the controller controls the fan to rotate at a first rotational speed; wherein, when the control interface learns that one of the fans is rotating at the first rotational speed according to the real-time fan information transmitted by each one of the fan modules, the control interface obtains the operation information and determines, according to the real-time fan information, whether or not to control another one of the fans adjacent to the one of the fans that is rotating at the first rotational speed to rotate at a second rotational speed; wherein the second rotational speed is less than the first rotational speed.

10. The fan control system according to claim 1, further comprising a machine learning module, wherein the control interface transmits the received real-time fan information and the corresponding operation information to the machine learning module for a machine-learning-based model training; wherein the operation information at least includes a central processing unit temperature and an application list that is currently executed by the computer device; wherein, through using a machine learning algorithm, the machine learning module calculates the rotational speed at which the fan of each one of the fan modules rotates when the computer device executes applications in the application list, so that the central processing unit temperature of the computer device is maintained at a predetermined temperature; wherein, when the control interface determines that the computer device is executing the applications in the application list according to the operation information, the control interface controls the fan of the corresponding fan module to rotate at the corresponding rotational speed according to suggestions made by the machine learning module.

* * * * *